United States Patent [19]

Michigami et al.

[11] Patent Number: 5,208,761
[45] Date of Patent: May 4, 1993

[54] METHOD FOR THE DIAMETER CONFIRMATION OF DRILLS IN A PWB MACHINE

[76] Inventors: Norio Michigami, 2-202, 4-3 Higashinaruse, Isehara-shi, Kanagawa; Tamio Otani, 814-14, Tsurumaki, Hadano-shi, Kanagawa; Yasuhiko Kanaya, 4-16-35, Tamagawagakuen, Machida-shi, Tokyo; Hiroyuki Kamata, Tejima-so 10, 2-38-3, Sagamigaoka, Zama-shi, Kanagawa, all of Japan

[21] Appl. No.: 637,789
[22] Filed: Jan. 7, 1991
[51] Int. Cl.⁵ .............................................. G01B 7/12
[52] U.S. Cl. ......................... 364/474.21; 364/474.37; 364/551.02; 483/12; 483/10
[58] Field of Search ............... 364/474.21, 474.37, 364/551.02; 483/8, 10, 12

[56] References Cited
U.S. PATENT DOCUMENTS 4,404,506  9/1983  Nishimura et al. .................... 483/10
4,567,659  2/1986  Kitamura .............................. 483/10
4,616,322  10/1986 Niwa et al. ..................... 364/474.21
4,809,426  3/1989  Takeuchi et al. ..................... 483/12
5,046,014  9/1991  Anjo ............................... 364/474.21

FOREIGN PATENT DOCUMENTS 58-126038  7/1983  Japan .................................. 483/12

Primary Examiner—Jerry Smith
Assistant Examiner—Patrick D. Muir
Attorney, Agent, or Firm—Wegner, Cantor, Mueller & Player

[57] ABSTRACT

A method is provided for the confirmation of the diameters of plural drills of different diameters in a PWB working machine in which the drills are interchangeably mounted to perform drilling. The method comprises storing, with respect to each of the drills, data on whether or not the drill has already been used, checking the data of one of the drills upon drill replacement, and measuring the diameter of the drill only where the drill has not previously been used.

1 Claim, 2 Drawing Sheets

FIG. 1
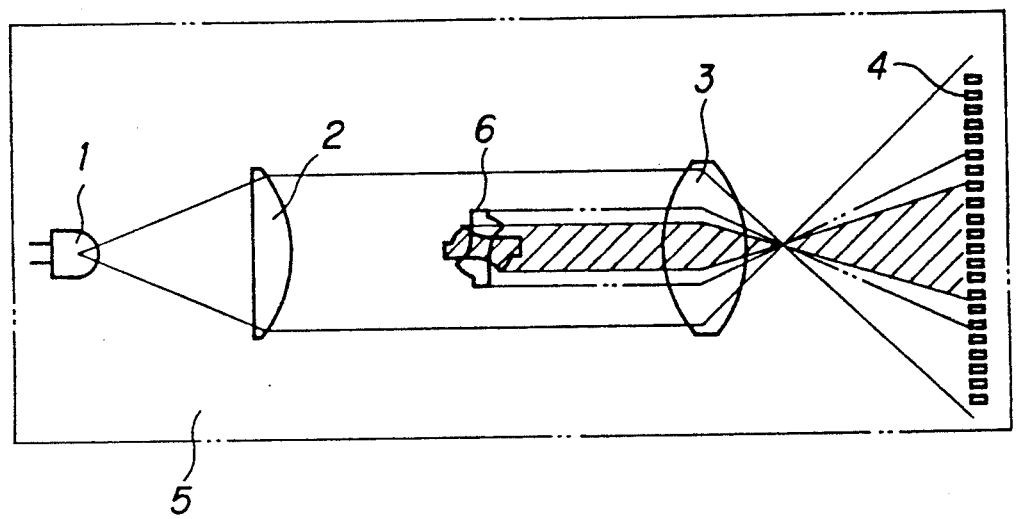
FIG. 2
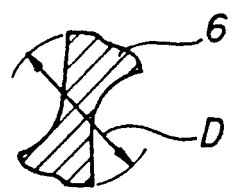
FIG. 4
| DRILL NUMBER | DRILL DIAMETER | NUMBER OF BORES ALREADY FORMED |
|---|---|---|
| 1 | 0.1 | 150 |
| 2 | 0.2 | 0 |
| 3 | 0.3 | 500 |

METHOD FOR THE DIAMETER CONFIRMATION OF DRILLS IN A PWB MACHINE

BACKGROUND OF THE INVENTION a) Field of the Invention

The present invention relates to a method for confirming whether the diameter of a selected or designated drill in a PWB (printed wiring board) working machine has a desired diameter or not.

b) Description of the Related Art With the increasing packaging density of electronic devices mounted on printed wiring boards in recent years, drills for boring such printed wiring boards are becoming smaller in diameter, leading to a substantial increase in the types of drills. On the other hand, PWB working machines are in many instances operated over a considerable duration. It is therefore now increasingly recognized that many drills of the same diameter should be stored in each PWB working machine.

In general, drills are manually placed in their corresponding storage positions specified in accordance with their diameters in a storage of a PWB working machine. During machining, the PWB working machine automatically replaces the drills and performs the machining. Namely, upon production of a drill replacement command, a drill which has been used until that time is automatically returned to the position where the drill was stored, in other words, to its home position and a drill conforming with the command is then automatically taken out from another storage position. This drill replacement is executed correctly without making any failure in the selection of these storage positions. However, due to the above-described increases in both the type and number of drills, there is increased risk that a drill may be manually placed in a wrong storage position, namely, a drill may be located in a storage position allocated to a drill of a different diameter. Such error has heretofore been found by inspecting each printed wiring circuit after completion of all bores drilled. This conventional method however involves the problems that the above inspection requires appreciable labor and time and a printed wiring board has to be thrown away where it has been drilled with a diameter other than that desired.

With a view toward overcoming such problems, drill diameter detectors have recently been developed to detect the diameter of each drill as it is brought into use on a PWB working machine. One example of such drill diameter detectors will hereinafter be described with reference to FIGS. 1 and 2 of the accompanying drawings.

FIG. 1 is a simplified plan view of a typical drill diameter detector, in which there are shown a light source 1, lenses 2,3 and a photodetector array 4. These elements make up the drill diameter detector which is identified generally at numeral 5. Designated at numeral 6 is a drill. The drill 6 has the cross-sectional shape shown in detail in FIG. 2. The diameter of the drill 6 is defined by a maximum dimension D.

To detect the diameter of the drill 6, the drill 6 which has been taken out automatically from a specific storage position in a storage and is a target of the detection is placed at the position, which is indicated in FIG. 1, in a direction perpendicular to the drawing sheet while the light source 1 is lit. Light from the light source 1 is converted to parallel rays by the lens 2, focused through the lens 3, and then projected against the photodetector array 4. Here, because of the existence of the drill 6, a shadow is formed as indicated by hatching. To ensure that the shadow reflects the maximum dimension D, the drill 6 is rotated at a low speed and the maximum number of photodetectors shaded in the photodetector array 4 is then counted, whereby the maximum dimension D, namely, the diameter of the drill, can be detected.

Detection of the diameter of the drill 6 with the drill detector 5 before working makes it possible to drill a bore of precise diameter in a printed wiring board. The drill 6 is repeatedly interchanged and used many times until a maximum number of bores preset for the drill 6 is reached. The diameter of the drill 6 is checked prior to each replacement by the drill 6.

Incidentally, chips of copper foil, resin and the like tend to stick on the drill 6 in the boring operation of a printed wiring board. When the use of the drill 6 is finished and the drill 6 is replaced by another drill, the drill 6 is stored, with the chips of copper foil, resin and the like still adhering to it to its specified position in the storage. When the diameter of the drill 6 is checked by the drill diameter detector 5 upon next use of the drill 6, an inaccurate measurement results due to the chips of copper foil, resin and the like stuck on the drill 6. This results in the selection of the drill 6 being canceled despite it being of the desired diameter.

SUMMARY OF THE INVENTION

An object of the present invention is therefore to overcome the above-described problems of the conventional techniques and to provide a method for the confirmation of the diameter of a drill in a PWB working machine, said method permitting error-free confirmation and improved work efficiency.

In one aspect of the present invention, there is thus provided a method for confirming the diameters of plural drills having different diameters in a PWB working tool in which the drills are interchangeably mounted to perform drilling. The method comprises:

storing, with respect to each of the drills, data on whether or not the drill has yet been used;

checking the data of one of the drills upon drill replacement; and measuring the diameter of the drill only where the drill has not previously been used.

With respect to each drill, there are stored data which permit a determination as to whether the drill has ever been used or not—i.e. data on the number of bores already formed by the drill. Upon replacement of another drill by the above drill, it is determined whether the replacement drill has ever been used or not (in the above example, how many bores have already been formed by the replacement drill). The diameter of the replacement drill is measured only where the replacement drill has not been used until that time (in the above example, where the number of bores already formed by it is 0).

According to the method of the present invention, the diameter of a drill is measured upon drill replacement only where the drill has not been used until that time. It is hence possible to avoid false measurements due to sticking of chips or a similar cause. It is also feasible to significantly decrease the frequency of drill diameter measurements, thereby improving the efficiency of work.

BRIEF DESCRIPTION OF THE DRAWINGS

FIG. 1 is a simplified plan view of a drill diameter detector;

FIG. 2 is a transverse cross-sectional view of a drill;

FIG. 4 is a fragmentary data table illustrating the details of data stored in a memory.

DETAILED DESCRIPTION OF THE INVENTION AND PREFERRED EMBODIMENT

Figure 3:
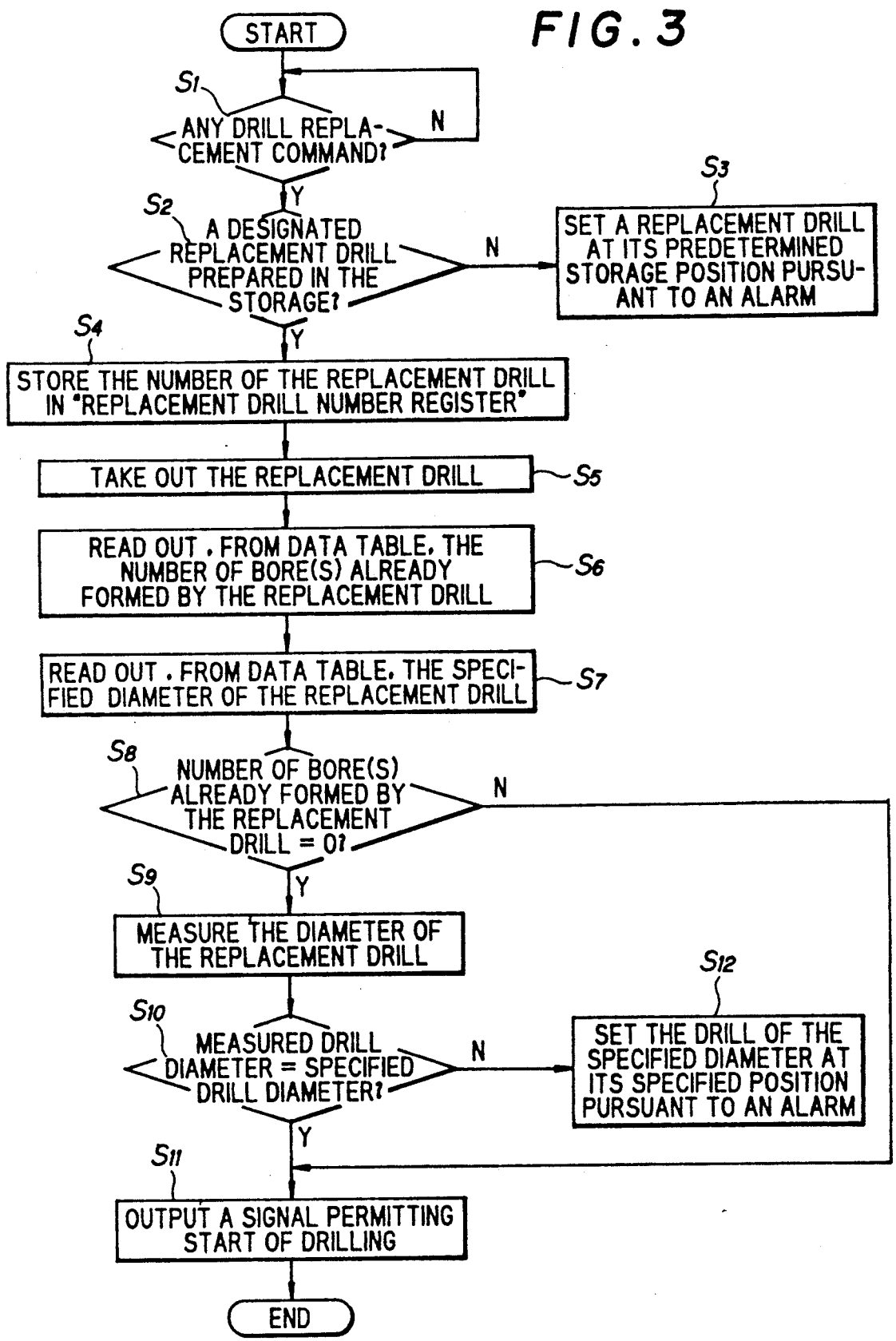
FIG. 3 is a flow chart showing a method for the confirmation of the diameter of a drill, which pertains to one embodiment of the present invention.

The present invention will hereinafter be described based on the embodiment illustrated in FIGS. 3 and 4 of the accompanying drawings.

Operation of a PWB working machine is controlled by an NC (numerically controlling) unit. The NC unit is equipped with a memory, in which drill numbers, drill diameters and the numbers of bores already formed by the individual drills are stored as shown in FIG. 4. Here, the term "drill numbers" means numbers allocated to the individual drills set at their specified storage positions in a drill storage of the PWB working machine. For each storage position, the diameter of the drill to be stored there is specified. In general, drills of various diameters—plural drills for each diameter—are stored in the drill storage. There are hence plural storage positions for each diameter. Needless to say, only one drill may be stored for one specific diameter in some instances. There is only one storage position for the specific diameter in such cases. The drill number of each drill is determined by its storage position. The term "drill diameter" indicates the diameter of the drill which should be stored at the storage position. By the term "number of bores already formed" is meant the number of bores which have been formed by the drill to which the drill number is allotted. Whenever a new bore has been formed, "1" is added to this number. The upper limit is preset for the number of bores. When the number of bores already formed reaches the upper limit, the drill will no longer be used, and another drill of the same diameter which is set at another storage position and has not reached the upper limit will be used instead. Specification for each drilling activity, such as drill rotating speed and feed depth, are stored in the memory. Description of such working conditions and their storage is however omitted herein as they have no direct connection to the present invention. FIG. 4 shows drilling work in which No. 1 drill of 0.1 mm diameter has been used to form 150 bores, No. 2 drill of 0.2 mm diameter has not been used, and No. 3 drill of 0.3 mm diameter has been used to form 500 bores.

A drill diameter confirmation method will next be described with reference to the flow chart shown in FIG. 3. In the machining of a printed wiring board, predetermined machining procedures stored on a tape or the like are read in by the NC unit. According to this drill diameter confirmation method, the NC unit reads each drill replacement and determines whether a drill replacement command has been outputted or not (Step $S_1$ depicted in FIG. 3). It is next determined whether a drill of the diameter designated by the drill replacement command is in the storage or not (Step $S_2$). A warning is produced when the storage does not contain any drill of the designated diameter (Step $S_3$). Pursuant to this alarm, an operator sets one or more drills of the designated diameter at a predetermined storage position or positions. When there is a drill of the designated diameter, the number of the drill (replacement drill) is stored once in a "replacement drill number register" (Step $S_4$). The drill is next picked up by a chuck or the like of the PWB working machine and is taken out of the storage position (Step $S_5$). With reference to the drill number of the drill, the number of bores already formed by the drill is thereafter read from the data stored in the memory and shown in FIG. 4 (Step $S_6$). Similarly, the diameter of the drill is read from the data stored in the memory (Step $S_7$).

Next, from the data already read, it is determined whether the number of bores already formed by the drill is 0 or not (Step $S_8$). When the number is 0, in other words, when the drill has not been used until that time, the diameter of the drill is measured by the drill diameter detector 5 depicted in FIG. 1 (Step $S_9$). The measurement results are then compared to the data of the specified drill diameter (Step $S_{10}$), said data having been read in Step $S_7$. When the measurement results are consistent with the data, the drill is found to have the diameter specified by the drill replacement command so that a signal permitting start of drilling is outputted (Step $S_{11}$) On the other hand, when the measurement results are not found to coincide with the specified drill diameter in Step $S_{10}$, in other words, when a wrong drill has been set at the predetermined storage position, a warning is produced ($S_{12}$). The wrong drill is then automatically returned to the predetermined storage position by the PWB working machine. The operator learns the false setting from the warning and resets a drill of the specified diameter at the predetermined storage position. It is also possible to design the PWB working machine such that, instead of production of the warning, the drill is automatically returned to an empty space in the drill storage, another drill of the specified diameter is taken out from the drill storage, and Steps $S_8$ through $S_{11}$ are then repeated with respect to the drill newly taken out. This is certainly more desirable as the machining can be continued without bothering the operator. When it is determined in Step $S_8$ that the number of bores already formed is not 0, in other words, the replacement drill has already been used, measurement of the diameter of the replacement drill is omitted and the procedure of Step $S_{11}$ is carried out immediately to output a signal permitting start of drilling. In accordance with this signal, machining work including drill replacement and subsequent drilling is performed.

Omission of the measurement of the diameter of the drill already used, as has been described above, is justified as the diameter of the drill was checked through Steps $S_8$ to $S_{10}$ upon the first use of the drill (i.e., upon first replacement by the drill) and each drill taken out from its storage position is always returned automatically to the same storage position after completion of its replacement by another drill. As a result, drill diameter measurement is applied only to drills which have not been used and are free of chips stuck thereon. This makes it possible to obviate erroneous measurement and further to significantly decrease the frequency of drill diameter measurements and hence to improve the work efficiency.

What is claimed is:

1. A method for confirming the diameters of plural drills of different diameters in a PWB working machine in which the drills are interchangeably mounted to perform drilling, which comprises:

storing, with respect to each of the drills, data on whether or not the drill has yet been used;

checking the data of one of the drills upon drill replacement; and measuring the diameter of the drill only where the drill has not previously been used.

* * * * *